United States Patent [19]
Panigrahi

[11] 4,084,154
[45] Apr. 11, 1978

[54] CHARGE COUPLED DEVICE MEMORY SYSTEM WITH BURST MODE

[75] Inventor: Godavarish Panigrahi, Piscataway, N.J.

[73] Assignee: Burroughs Corporation, Detroit, Mich.

[21] Appl. No.: 573,805

[22] Filed: May 1, 1975

[51] Int. Cl.² ............................................. G11C 7/00
[52] U.S. Cl. .................................... 365/222; 365/78; 365/73; 364/900
[58] Field of Search .................. 340/173 DR, 173 CA

[56] References Cited

U.S. PATENT DOCUMENTS

| | | | |
|---|---|---|---|
| 3,748,651 | 7/1973 | Mesnik | 340/173 CA |
| 3,760,379 | 9/1973 | Nibby, Jr. et al. | 340/173 DR |
| 3,859,640 | 1/1975 | Eberlein et al. | 340/173 DR |

OTHER PUBLICATIONS

Capacitor Storage Ring, Callahan; I.B.M. Tech. Discl. Bull.; p. 17; vol. 2, No. 3; Oct. 1959.

*Primary Examiner*—Marshall M. Curtis
*Attorney, Agent, or Firm*—Robert J. Gaybrick; Larry M. Jarvis; Kevin R. Peterson

[57] ABSTRACT

A circular shift register memory system comprising L sections each having K circular charge storage shift registers of N bits each for storing blocks of N, K-bit words and accessing the words or blocks thereof in parallel. The L memory sections are refreshed by N-bit clock bursts which are successively and periodically applied to the memory sections by a refresh counter, decoder and gating logic. A read/write decoder decodes memory section addresses and controls the application of N-bit clock bursts to the particular addressed memory sections for access purposes. In a random access mode, word access is facilitated by counters which count the number of read/write or refresh clock pulses for comparison to a word address. A memory section comparator prevents interference between access and refresh operations by inhibiting the refresh circuitry if the refresh counter directs refresh of a memory section undergoing access and by inhibiting the read/write circuitry in certain cases where access is requested to a memory section undergoing refresh.

18 Claims, 11 Drawing Figures

REFRESH CYCLE

R-W CYCLE

R-W While in the middle of refreshing.

CE SIGNAL ENABLES THE READ / WRITE FOR THE SHIFT REGISTER.

CHARGE COUPLED DEVICE MEMORY SYSTEM WITH BURST MODE

BACKGROUND OF THE INVENTION

This invention relates broadly to computer memory systems and more particularly to such systems organized from circular shift registers which require periodic refreshing.

The advantages obtainable by organizing memory systems comprising loops of charge storage elements, for example, charge coupled devices or MOS devices, are well-known. Basically, high packing densities and rapid access are obtainable. While these advantages appear, several complications arise when one attempts to organize a memory system from charge storage shift register loops.

These complications arise from two competing concerns. First, it is necessary to intermittently refresh the contents of the charge storage elements. Such refresh is accomplished by circulating the shift register contents. Each such shift results in power dissipation in the memory system. Therefore, it is desirable to keep such circulation to a minimum. On the other hand, it is desirable to have immediate access to the data stored in the circular shift registers whenever the associated computer system demands access. A conflict may arise because the computer system may demand access to data stored in shift registers which are currently being circulated for refresh purposes. Thus, there exists a critical problem in synchronizing and coordinating the refresh and access operations in order to provide maximum flexibility, minimum power dissipation and errorfree operation.

SUMMARY OF THE INVENTION

It is therefore an object of the invention to provide an improved computer memory system.

It is another object of the invention to provide a computer memory system of circulating charge storage shift registers having means for orderly accessing and refreshing the shift registers while providing a minimum of interference between the refresh and access operations.

It is an additional object of the invention to provide such a computer memory system in which the instantaneous power dissipation is minimal.

It is yet another object of the invention to allow access to such a memory system in either block or random modes.

These and other objects and advantages of the invention, which will later become apparent, are obtained by employing what may be characterized as a burst mode of operation. In the burst mode of operation, sections of an array of charge storage shift registers are successively refreshed by bursts of clock pulses. Therefore, at any one time, only a small number of the registers in a large memory array are being refreshed. Thus, most of the registers are available for access and instantaneous power dissipation is kept at a minimum. When access is desired to a register currently being refreshed, the access is delayed by control means. When a refresh operation is dictated on a register currently being accessed, the access operation itself is allowed to refresh the particular registers involved.

Further control may be provided according to the invention to access either entire blocks of data words or individual words stored in the charge storage shift register sections. Word access is accomplished by counting clock pulses used to circulate the particular memory section storing the word and comparing the count to a word address. Block access is accomplished by delivering a burst of clock pulses to read or write all of the words in a particular memory section.

BRIEF DESCRIPTION OF THE DRAWINGS

The particular implementation of the invention and concomitant advantages will become apparent after consultation of the detailed description of the preferred embodiment of the invention, read in conjunction with the drawings of which.

DETAILED DESCRIPTION OF THE PREFERRED EMBODIMENT

Figure 1:
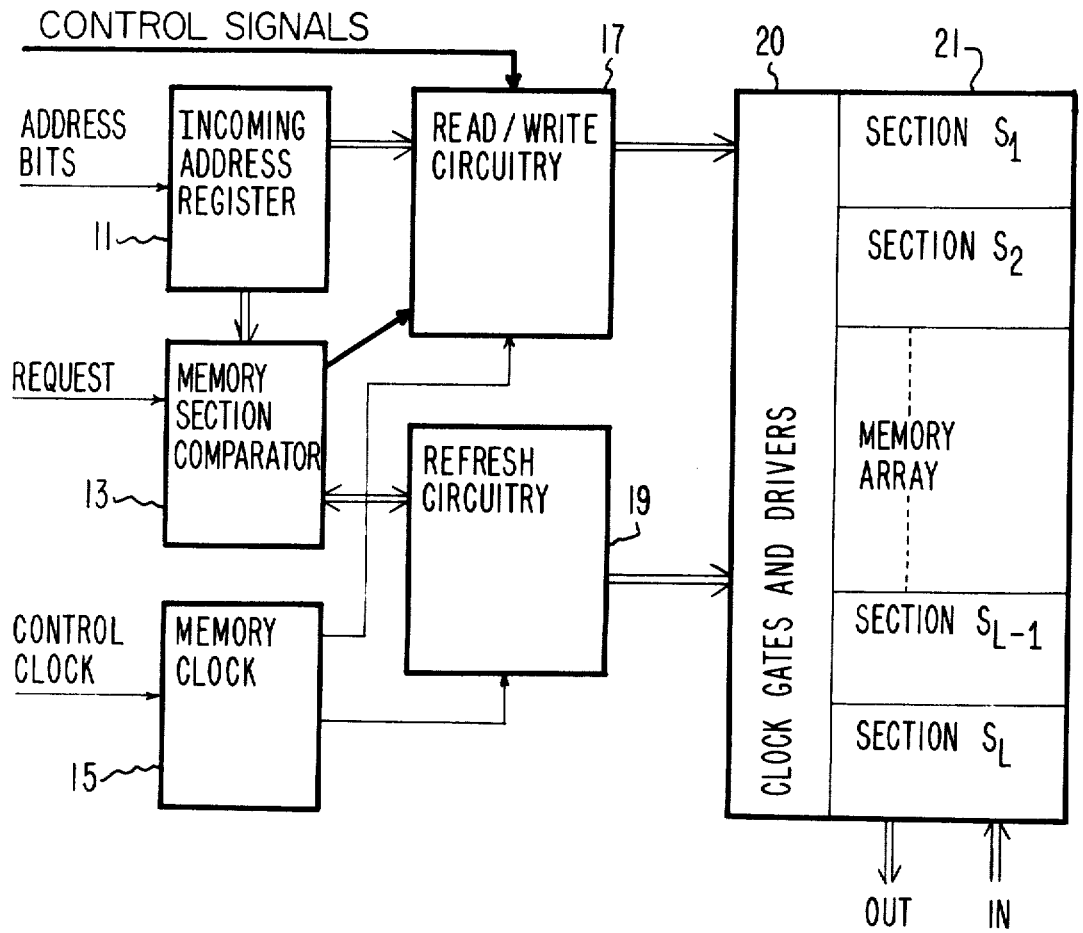
FIG. 1 is a generalized block form of the scheme of the preferred embodiment of the invention.

The general scheme of the memory system of the preferred embodiment of the invention is shown in FIG. 1. As there illustrated, the memory system includes a shift register array 21 and associated clock and gating circuitry 20. The clock and gating circuitry 20 is controlled by read/write circuitry 17, and refresh circuitry 19. The refresh circuitry 19 periodically refreshes the shift register contents in the array 21 with bursts of clock pulses derived from a memory clock 15. If an associated computer system requests access (reading or writing of data) by supplying a request to a memory section comparator 13 and a series of address bits to an incoming address register 11, the memory section comparator 13 supplies control signals to the refresh circuitry 19. In turn, the refresh circuitry 19 may inhibit or otherwise control the refresh operation. The incoming address register 11 supplies address signals to the read/write circuitry 17, which, together with read/write, random mode, and block mode signals, control the accessing of data in the shift register array 21 in coordination with the refresh circuitry 19.

Figure 2:
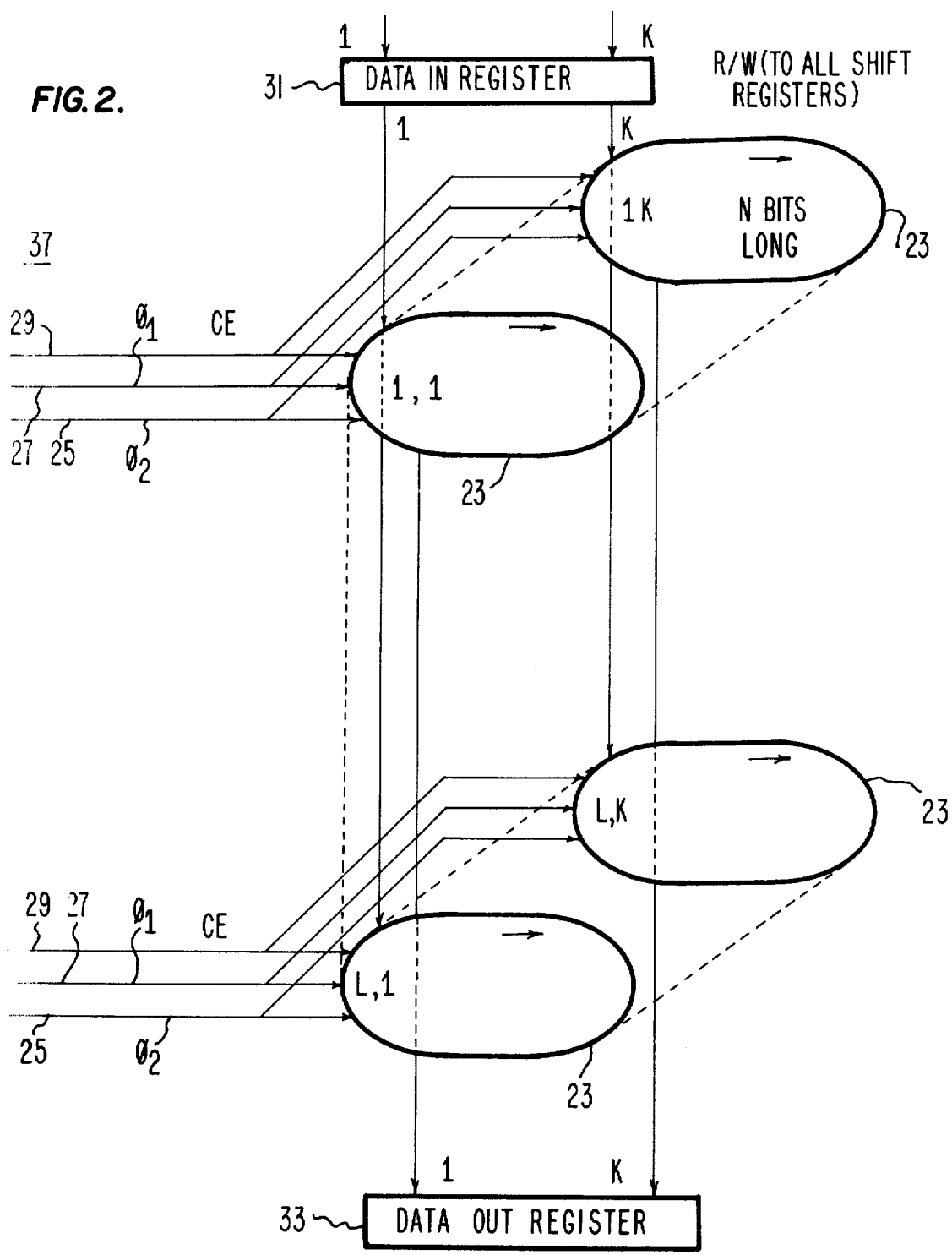
FIG. 2 is a schematic diagram of the circulating shift register memory array of FIG. 1.

The shift register array 21 is shown in more detail in FIG. 2. The storage portion of the array 21 is made up of a rectangular array of L x K circular shift registers 23, each of which contains N bits. Each section or row in this array, for example sections $S_1$ composed of registers (1, 1); (1, 2)... (1, K), comprises a data block storage area for storing in parallel N words of K bits each.

Each register 23 in any particular section is supplied by the same set of clock and control lines 25, 27, 29. All of the circular shift registers 23 are supplied with an output line leading to the data OUT register 33 and with read and write control signals R, W. In the preferred embodiment, the circular shift registers are of the two phase charge coupled device (CCD) type.

Figure 3:
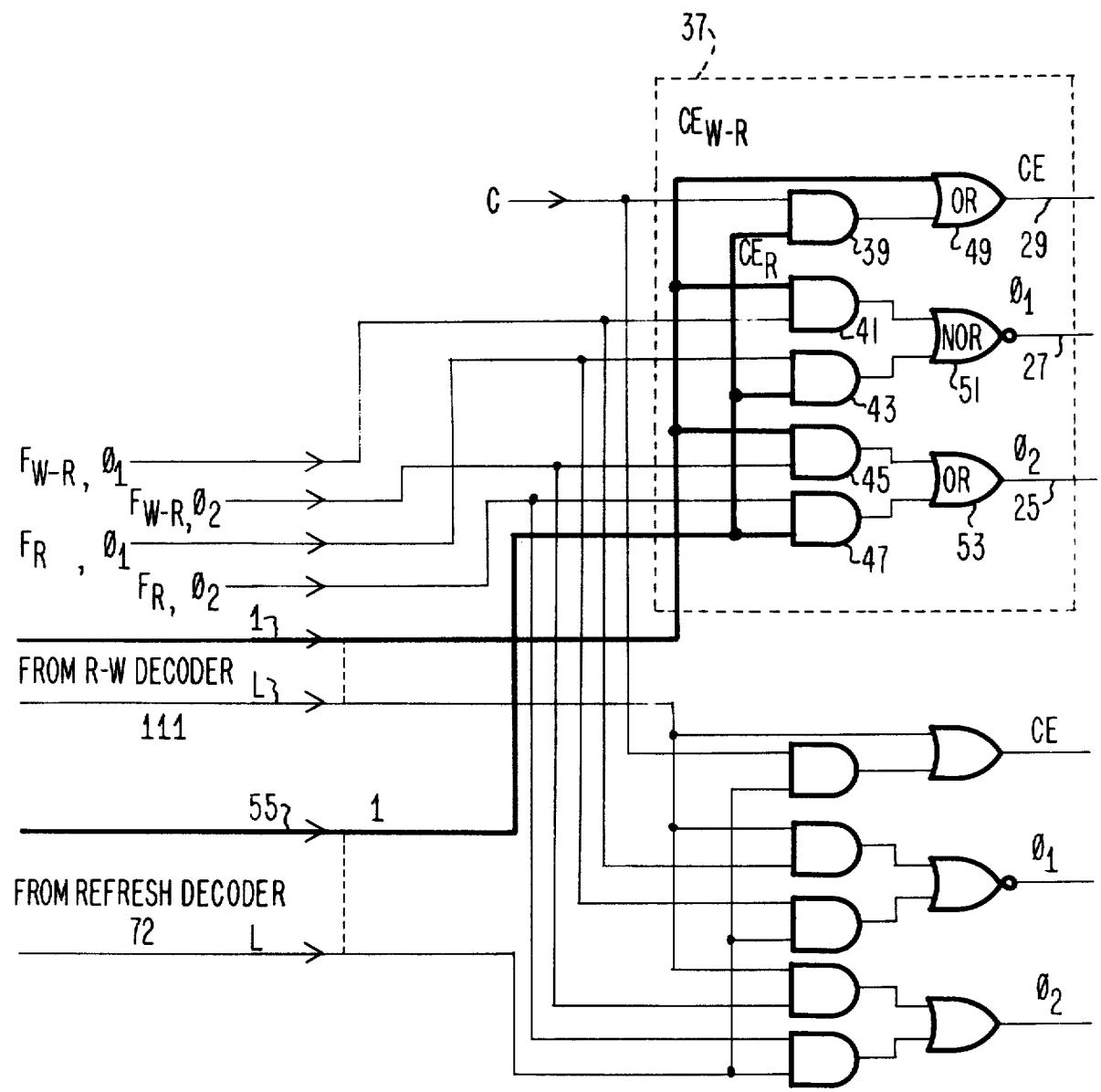
FIG. 3 is a schematic circuit diagram of logic associated with the shift registers of FIG. 2 for refresh and access operations.

The control line 29 and clock lines 25, 27 emanate from a gating logic unit 37 shown in FIG. 3. A similar unit 37 is associated with each row 1, 2 . . . L of the memory array 21. Two AND gates 45, 41 and an OR gate 49 receive an input from the first output line of a read/write decoder 111 shown in FIG. 9. The two AND gates 41, 45 receive second inputs from the read/write clock control lines $F_{WR, \phi_1}$ and $F_{WR, \phi_2}$.

Figure 5A:
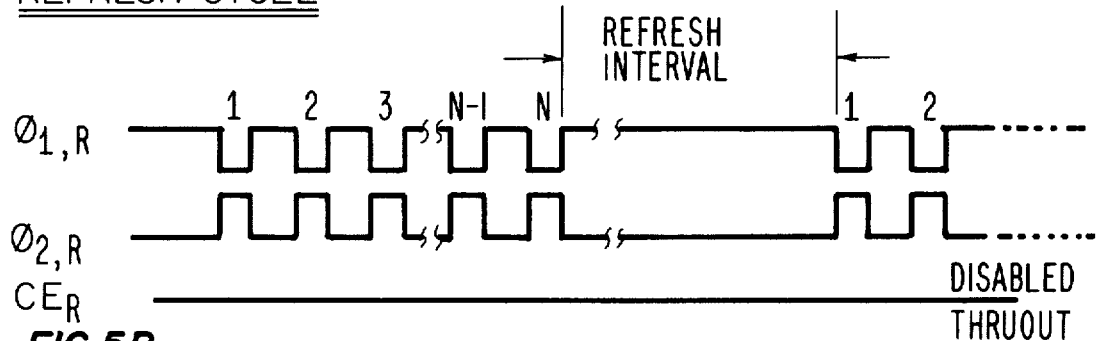
FIGS. 5A, 5B and 5C are timing diagrams showing the relation of system control signals to system clock signals applied to the shift register memory array of the preferred embodiment of the invention.
Figure 5B:
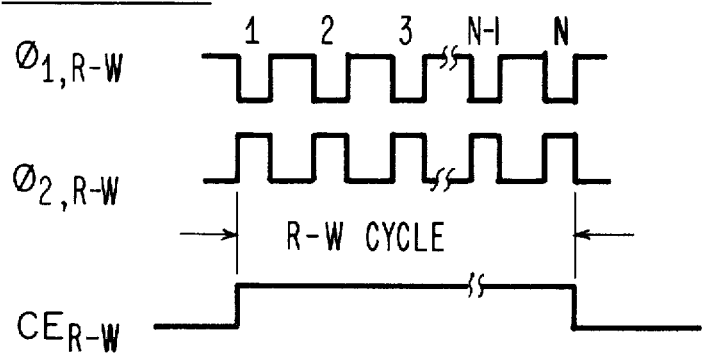
Figure 5C:
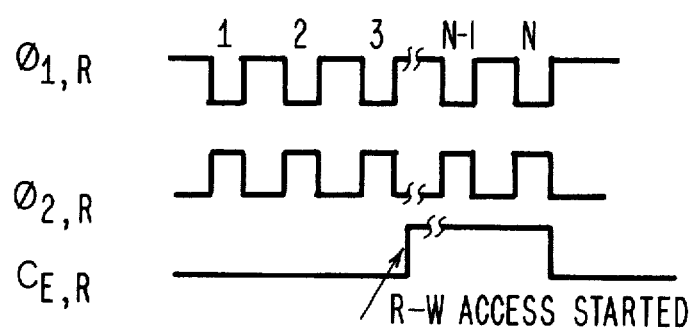

Thus, when the read/write decoder 111 selects section 1, clock signals $\phi_1$ and $\phi_2$ are gated through the AND gates 41, 45; a NOR gate 51; and an OR gate 53 to drive the circular shift registers 23 of the first section of the memory array 21. Gate 51 should be a NOR gate to preserve the proper $\phi_1$ signal level, as shown in FIG. 5. In the preferred embodiment, a high level signal applied to $\phi_1$ during non-access and non-refresh states corresponds to the potential required for creating the deep depletion well under $\phi_1$ electrodes of a two phase CCD shift register for charge holding. Additionally, the output signal from the read/write decoder 111 is gated through the OR gate 49 to provide a control signal CE to the shift registers 23 in the first section of the memory array 21.

Similarly, a line from a refresh decoder 72 (FIG. 4) is supplied as an input to each of three AND gates 47, 43, and 39. Two of these AND gates 43, 47 receive second inputs from a refresh clock 74 (FIG. 4) on lines $F_R$, $\phi_2$ respectively. The other AND gate 39 is supplied with a control signal C as its second input. Thus, if the refresh decoder 72 selects the first section $S_1$ of registers (1, 1); (1, 2); . . . (1, K), clock signals are gated through the AND gates 43, 47 and the NOR and OR gates 51, 53 to clock the circular shift registers 23 of the first section of the memory array 21. In the event that a control signal C is also supplied to the AND gate 39, the control signal CE is supplied via the OR gate 49 to all of the registers 23 in the first section $S_1$ of the memory array 21. The particular utility of the above-described circuitry will become more apparent as successive figures and features of the invention are discussed.

Figure 4:
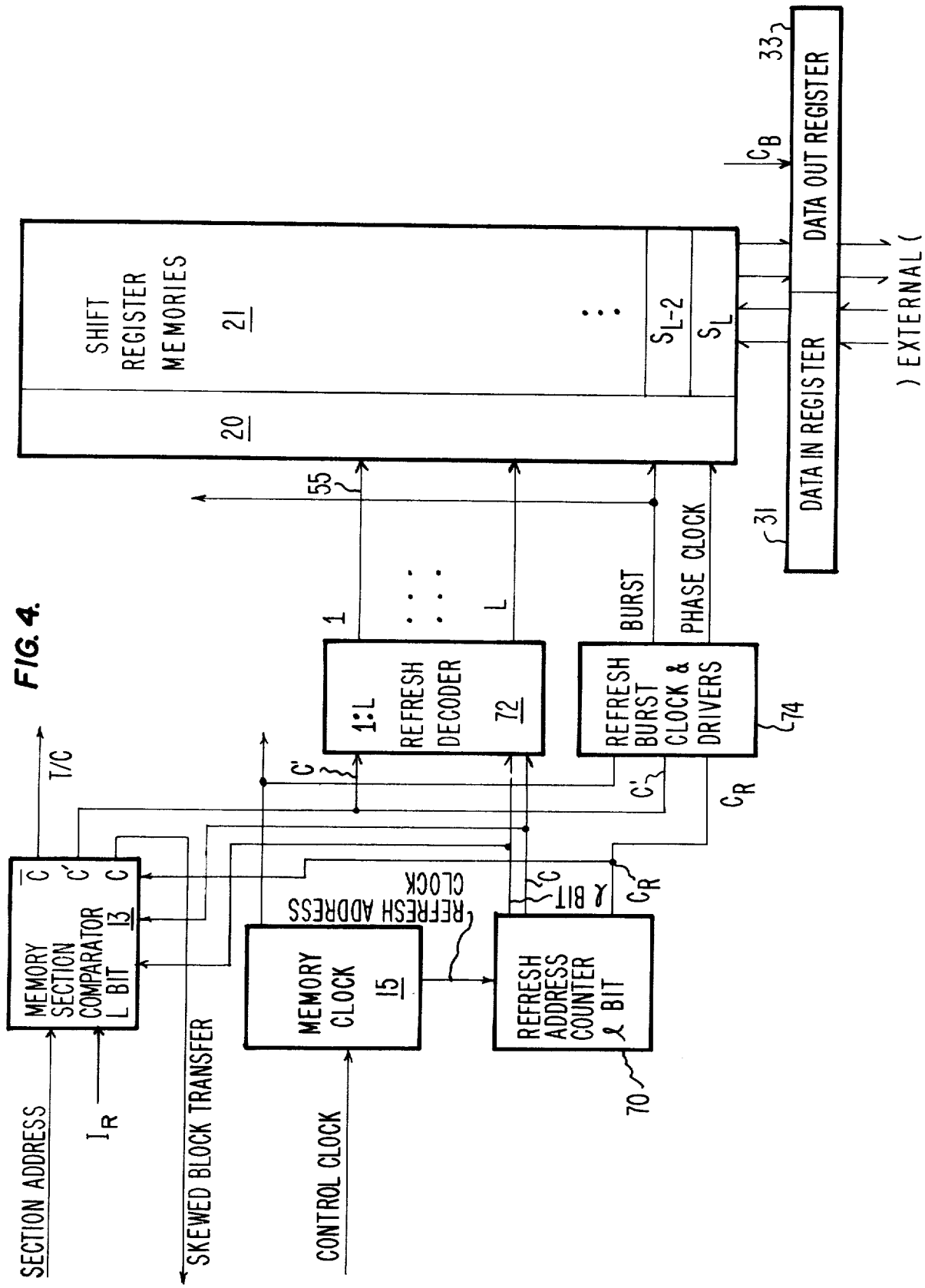
FIG. 4 is a schematic diagram of circuitry providing burst mode refresh of the memory bank of the preferred embodiment of the invention.

The refresh circuitry 19 is shown in more detail in FIG. 4. This circuitry includes a refresh address counter 70, a refresh decoder 72 and a refresh burst clock and drivers unit 74.

In general, the shift register semi-conductor memory array 21 is refreshed periodically by applying a set of burst clock pulses to successive shift registers sections $S_1, S_2 \ldots S_L$. For the memory shown in FIG. 2 there are L shift register sections. The refresh address counter 70 is chosen to be an l bit counter where $2^l$ equals L. This counter 70 is utilized to produce an l bit address for driving the refresh decoder 72. The standard decoder 72 decodes the l bit address into a single signal supplied on one of its output lines 1 through L to a gating logic unit 37 of FIG. 3. This signal then activates the AND gates 43, 47 as described above to permit clock signals to be supplied to the shift registers 23 of the particular memory section $S_1, S_2 \ldots S_L$ selected.

The clock pulses necessary to clock the memory section selected by the refresh decoder 72 are supplied by the refresh burst clock 74. In the preferred embodiment of the invention two clock phases $\phi_1$ and $\phi_2$ are employed (See FIG. 5). This method of clocking CCD shift registers is well-known in the art.

Thus, as the refresh address counter 70 is stepped by the memory clock 15 its l bit address is successively incremented. Each time this address changes, a new output line 1 through L of the refresh decoder 72 is enabled, and a burst of N clock cycles is supplied to the refresh clock control lines $F_{R, \phi_1}$ and $F_{R, \phi_2}$ (FIG. 3). The result is that the particular memory array section $S_1, S_2 \ldots S_L$ represented by the output of the counter 70 is supplied with clock pulses which circulate and thereby refresh the contents of the circular shift registers 23 in the selected section $S_1, S_2 \ldots S_L$. When the counter 70 reaches maximum count, it resets and begins a new count so that the shift register sections $S_1, S_2 \ldots S_L$ are continuously circulated in succession.

The memory section comparator 13 serves to coordinate the operation of the refresh circuitry 19 with read/write operations instituted by the read/write circuitry 17. The memory comparator 13 is supplied with the l bit address produced by the refresh address counter 70 each time it steps to a new bit address. Additionally, the memory section comparator 13 is supplied with an incoming request signal $I_R$ indicating that the associated computer system wishes access, and also with an l bit memory section address supplied simultaneously with the incoming request by the incoming address register 76 of FIG. 9.

The l bit memory section comparator 13 compares the l bit incoming section address with the l bit address of the present memory section that is being refreshed. It produces three output control signals denoted C, $\bar{C}$ and C', depending on the results of the comparison and the status of the incoming request and count change signals $I_R$ and $C_R$. In the case that a memory section to which access is requested is different from that being presently refreshed the control signal values are C = 0, $\bar{C}$ = 1 and C' = 0. No conflicts occur, and the memory section comparator 13 does not interfere with either refresh or access operations. However, there are two cases in which the memory section comparator 13 will so interfere.

In the first case, an incoming request may be directed to a shift register section $S_1, S_2 \ldots S_L$ that is presently being refreshed. In this case the output C of the comparator 13 becomes equal to one, and the output $\bar{C}$ becomes equal to zero. In the preferred embodiment of the invention, these signals indicate to the computing system: 1) that block writing is not allowed and 2) that if a data block is read from the memory system the word order in the block will be skewed. If data readout from the memory is skewed, it may be realigned externally in the main memory, if so desired, by the help of a skew address which may be developed as hereafter detailed. By not allowing writing of a block of K words in the middle of a refresh period, one avoids the problem of synchronizing the block after the write operation. Since, in most computing systems, block writing is not a frequent operation and can be postponed until the refresh is finished, it may be more desirable to disallow block writing as is done in the preferred embodiment of the invention.

In the second case, a refresh request may be made to a memory section $S_1, S_2 \ldots S_L$ which is being presently accessed. In that case, refresh is not necessary since the memory section will be refreshed by the access. Therefore, the refresh to that particular section is suppressed.

This suppression is accomplished by the control line C' from the memory section comparator 13, which in such a case inhibits the refresh clock 74 and the refresh decoder 72. The decoder 72 may be simply inhibited by AND-ing each of its outputs with the inverted value of C'. Whenever the control signal C' equals 1, the control signal C is forced to zero.

Figure 6:
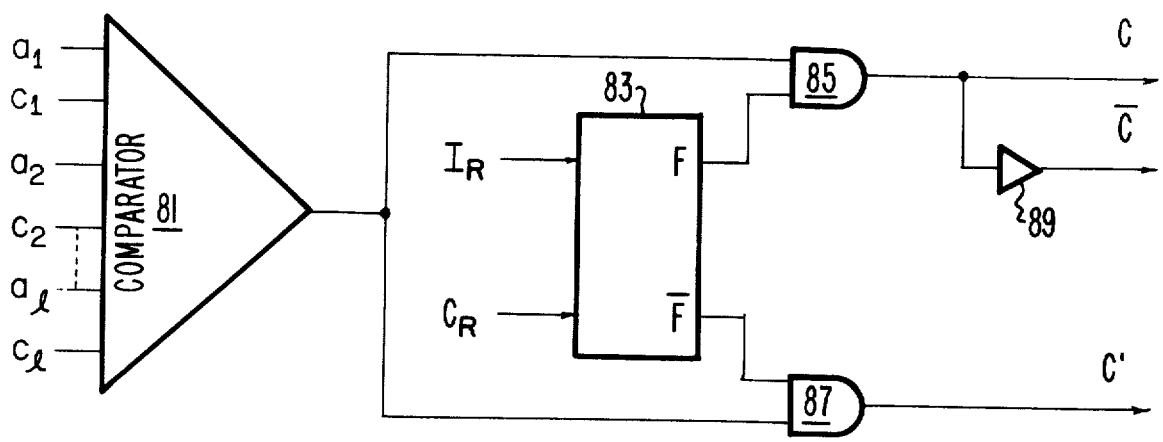
FIG. 6 is a logic diagram of the memory section comparator of FIG. 4.

A memory section comparator circuit 13 for producing the above signals C, $\overline{C}$, C' is shown in more detail in FIG. 6. It includes a multi-bit comparator 81 which receives and compares the memory section address bits $a_1, a_2 \ldots al$ with the count bits $c_1, c_2, \ldots cl$ outputted by the refresh address counter 70. In case the section address and refresh address counter count are identical, the comparator 81 outputs a positive level to the inputs of two AND gates 85, 87. The second input of the AND gate 85 is supplied by the F output of a flip-flop 83, and the second input of the AND gate 87 is supplied with the $\overline{F}$ output of the flip-flop 83. The flip-flop output F is set high by an incoming request signal $I_R$ and reset low by the count change signal $C_R$. The output $\overline{F}$ maintains the inverse of the value of the output F. The output of the AND gate 85 constitutes the control signal C, which is inverted by an inverter 89 to provide the control signal $\overline{C}$. The output of the AND gate 87 is the control signal C'.

Assuming that the section address and refresh counter output do not match, the output of both AND gates 85, 87 is low and hence C = 0, $\overline{C}$ = 1 and C' = 0. If a new matching address is then presented, along with an incoming request signal $I_R$, both inputs to the AND gate 85 are high and C = 1 while $\overline{C}$ = 0. If, on the other hand, the counter output shifts to an address currently being accessed, the output of the comparator 81 changes to a high level and the flip-flop 83 is reset by the count change signal $C_R$. Hence, the output of the AND gate 87 goes high, and the output of the AND gate 85 goes low. C' is then high, C is low and $\overline{C}$ is high.

Figure 7:
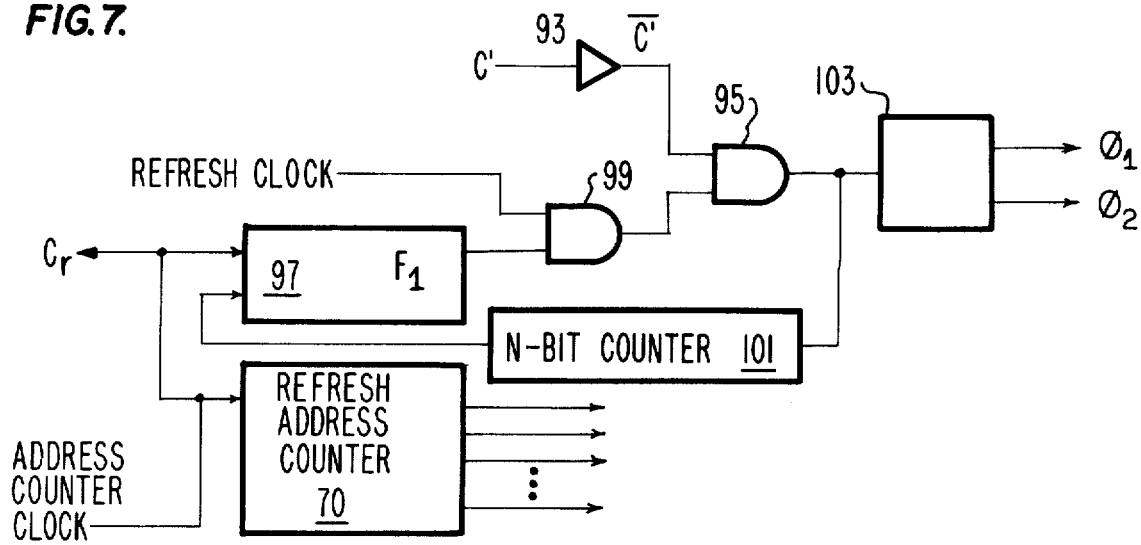
FIG. 7 is a logic diagram of the refresh counter and burst clock of FIG. 4.

The refresh burst clock 74 and refresh address counter 70 are shown in more detail in FIG. 7. The refresh counter 70 is driven by clock pulses separated by a duration larger than the duration of the N bit burst delivered to circulate the shift registers 23 in any particular memory section $S_1, S_2 \ldots S_L$. Whenever the count of the basic counter 70 changes, the count change control signal $C_R$ is produced. Hence, $C_R$ may be derived from the input to the refresh counter 70 if the refresh counter 70 is a simple ripple counter. The count change control signal $C_R$ is transmitted to the input of a flip-flop 97, whose output $F_1$ is connected to a first AND gate 99. A second input of the AND gate 99 is supplied with a clock signal from the memory refresh clock 15. When the output $F_1$ of the flip-flop 97 is set high by the count change signal $C_R$, the refresh clock is gated through the output of the AND gate 99 and an AND gate 95 to an N-bit counter 101 and a phased clock driver 103. After a burst of N pulses the counter 101 resets the flip-flop 97.

The refresh clock 74 and refresh address counter circuitry then function as follows. As long as the control signal C' is low, the count change signal $C_R$ will set the flip-flop 97 and gate a burst of N clock pulses through the AND gates 99, 95 each time the count of the refresh counter 70 changes. However, if the control signal C' produced by the memory section comparator 13 goes high because the counter 70 indicates a refresh operation is to be performed on a shift register section $S_1, S_2 \ldots S_L$ currently being accessed, no clock pulses are gated through the AND gate 95. The phased clock driver 103 simply serves to produce properly phased clock signals (FIG. 5) for driving the CCD shift registers, as well-known in the art. Thus, as long as C' remains low, the memory sections $S_1, S_2 \ldots S_L$ are successively refreshed by bursts of clock pulses.

The scheme and apparatus for conducting refresh operations has now been detailed. The control of read/write access operations will now be more fully explained. At this point, it is useful to explore the shift register input-output circuitry in somewhat more detail.

Figure 8:
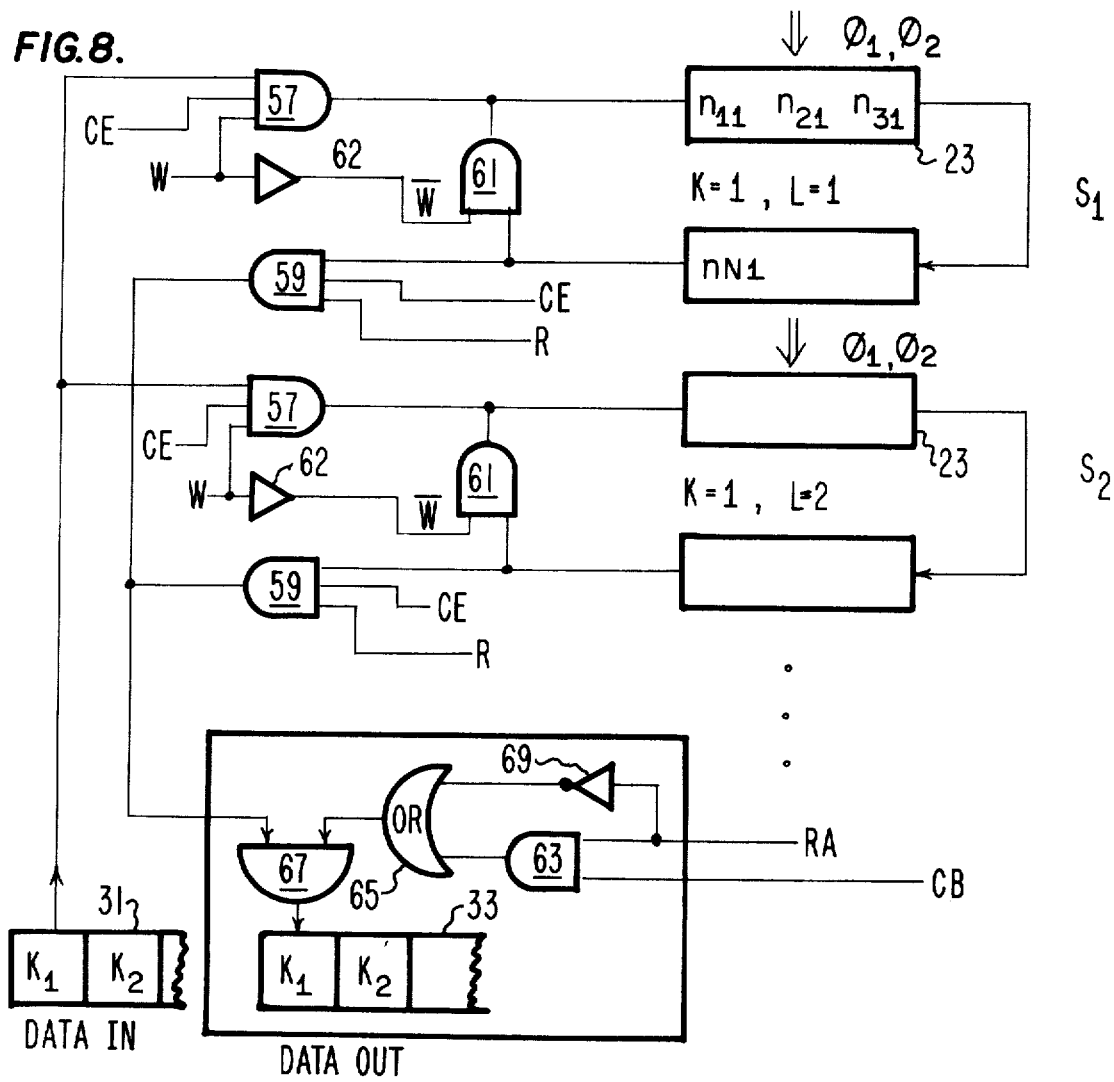
FIG. 8 is a schematic and logic diagram more particularly illustrating the read/write circuitry associated with the shift register array of the preferred embodiment of the invention.

A particular column of shift registers 23 is shown in detail in FIG. 8 to illustrate the logic used for controlling input and output to each register 23. Each column 1, 2 ... K may be so organized to provide parallel access to each of the N, K-bit words stored in each memory section $S_1, S_2 \ldots S_L$.

Input to a register loop 23 is controlled by an input AND gate 57, which receives an input of the first bit $K_1$ of a word to be inputted from the data-in register 31. The input AND gate 57 receives additional inputs of the control signal CE and the write control signal W. Data is permitted to circulate by the refresh AND gate 61, which allows recirculation unless a write operation is underway, in which case the input $\overline{W}$ supplied by an inverter 62 is low.

Data read-out is enabled by an output AND gate 59 when it is supplied with the control signal CE and a read signal R. The output of the output AND gate 59 is subjected to further control by a second output AND gate 67. This AND gate 67 enables single word read-out when a random access is indicated by control signals RA and CB, supplied as later detailed. The signals RA and CB are supplied to an AND gate 63, which outputs to an OR gate 65. A second input of the OR gate 65 is supplied with the inverse $\overline{RA}$ of the random access signal RA. Thus, when block access is desired, the inverse of the random access signal $\overline{RA}$ is high, and data outputted from the first output AND gate 59 will be outputted through the second output AND gate 67 into the data out register 33. However, if random access is desired and the random access signal RA is high, a word will only be outputted to the data out register 33 if a signal $C_B$ is received by the AND gate 63. The manner of production of the control signal $C_B$ will become apparent in the subsequent discussion.

Figure 9:
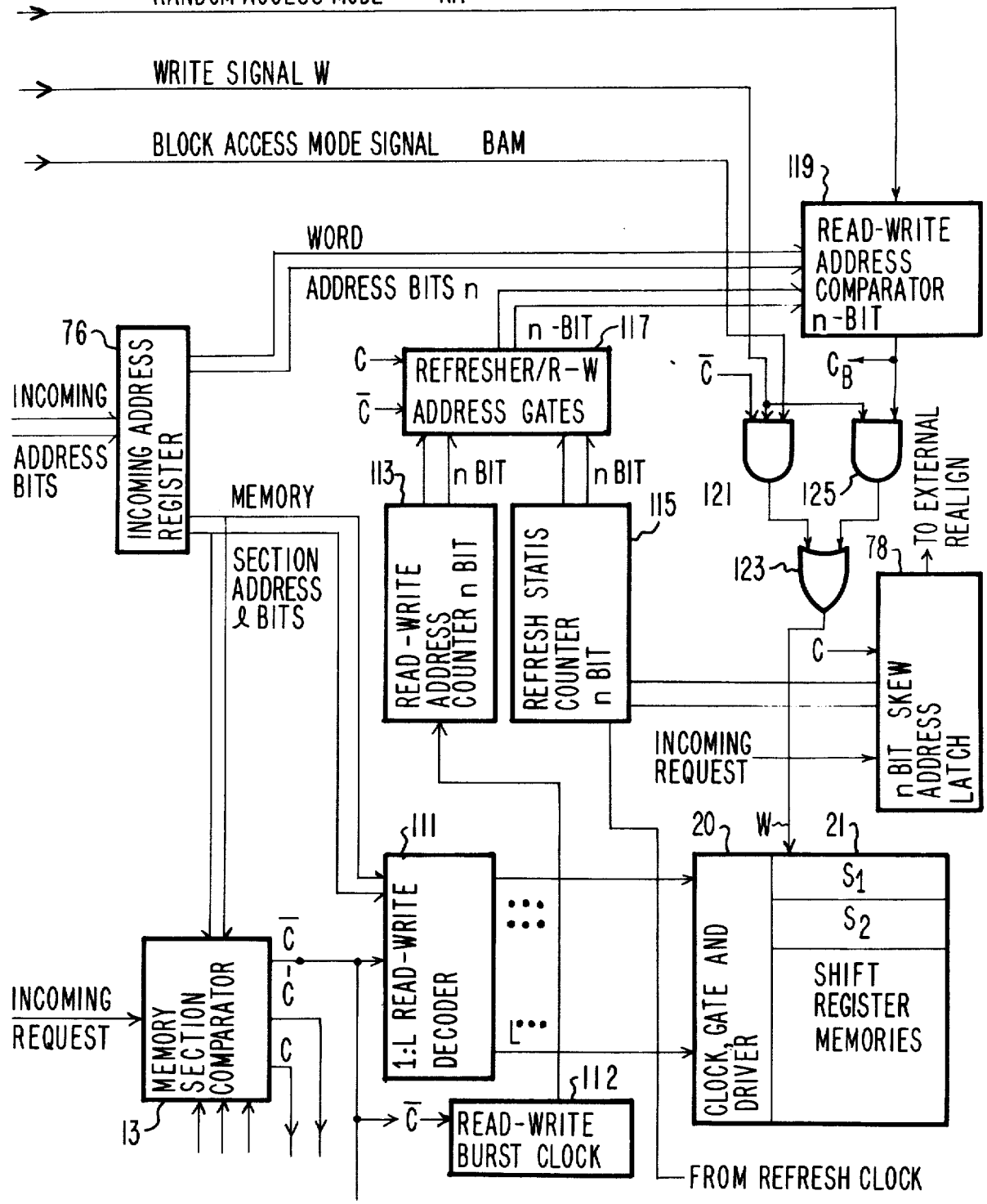
FIG. 9 is a schematic diagram of circuitry facilitating random and block access to the shift register memory of the preferred embodiment.

To provide the proper control for accessing a particular memory section $S_1 \ldots S_L$, a read/write decoder 111 and an AND gate 121 and OR gate 123 are used (FIG. 9). The read/write decoder 111 is supplied with an l bit memory section address, which it converts into an output signal on one of the output lines 1 ... L. The operation of the decoder 111 is controlled by the control signal $\overline{C}$, as is the read/write burst clock and driver unit 112. Thus, the read/write decoder 111 and the read/write clock circuitry 112 are inhibited when the memory section address presented to the decoder 111 and to the memory section comparator 13 identifies a memory section which is currently being refreshed by the refresh circuitry 19. The read/write clock 112 and decoder 111 may be inhibited by circuitry similar to that already discussed with respect to the refresh decoder and refresh clock circuitry.

As before noted with reference to FIG. 3, the read/write clock 112 drives the clock lines $F_{WR, \phi_1}$ and $F_{WR, \phi_2}$. The operation of the gating logic units 37 is such that clock pulses cannot be gated out on the lines 25, 27 to clock a particular memory section $S_1 \ldots S_L$ unless a positive signal is received from the read/write decoder 111. When such a signal is received a burst of N clock pulses is delivered to the lines of the shift registers 23 in the particularly selected memory section to completely circulate an entire block of N words. The control signal CE produced by the gating logic unit 37 cooperates in the outputting of a block of selected words by providing a high input signal to the input and output AND gates 57, 59 (FIG. 8) associated with each of the shift registers 23 in a selected shift register section $S_1 \ldots S_L$.

For these input and output gates 57, 59 to allow access to the data words, it is also necessary that they be supplied with read and write signals R, W. In the preferred embodiment of the invention, if block reading is desired, a read signal R is applied directly to the output AND gates 59 of all the sections $S_1 \ldots S_L$ of shift registers 23. The particular section from which data is read out is selected by the signal CE. Thus, block reading is done regardless of whether a particular shift register row is being refreshed. Block writing is performed in a somewhat different manner in the preferred embodiment of the invention.

An AND gate 121 and an OR gate 123 cooperate to synchronize the writing of data by controlling production of the write signal W. The AND gate 121 is supplied with the control signal $\overline{C}$, which is high whenever the read/write decoder 111 and the read/write clocking circuitry 112 are enabled, i.e., as long as access is not desired to a shift register section $S_1 \ldots S_L$ currently being refreshed. During a write-block access operation, the AND gate 121 is further supplied with a write signal W and a block access mode signal BAM as second and third inputs. When the write signal W, the block access mode signal BAM and the control signal $\overline{C}$ are high, a write signal W is gated via the OR gate 123 to each of the input AND gates 57 associated with the circular shift register 23. Thus, the input AND gates 57, which receive both a control signal CE and a write signal W are enabled to input data. It should be apparent that reading could be similarly synchronized if desired.

If it is desired to access an individual K-bit word stored among a block of N words in a particular memory section $S_1 \ldots S_L$, additional circuitry is employed including a read/write address counter 113 a refresh status counter 115, refresh/read/write address gates 117, a read/write address comparator 119 and a skew address latch 78. If a word is to be accessed, the random access mode signal RA supplied to the read/write address comparator 119 by the associated computer system is high and the block access mode signal BAM supplied to the AND gate 121 is low. Hence, a write signal W cannot be produced by the AND gate 121, but rather can only be produced by an output from an AND gate 125.

Initially, in an individual word access, an l bit memory section address and an n bit word address are supplied to the incoming address register 76. The l bit sectional address is decoded to enable a particular memory section $S_1 \ldots S_L$ as described in the preceding paragraphs. The word address is held in the read/write address comparator 119. This word address is compared to the outputs of the refresh/read/write address gates 117. These outputs are supplied by either the read/write address counter 113 or the refresh status counter 115, depending on the value of the control signals C and $\overline{C}$.

Assuming $\overline{C}$ equals 1, the read/write clock circuitry 112 is circulating a particular memory section as dictated by the read/write decoder 111. The read/write address counter 113 counts the clock pulses delivered by the read/write clock 112 and delivers this count to the address gates 117 for comparison with the word address in the comparator 119. When the contents of the read/write address counter 113 equal the word address, the read/write address comparator 119 outputs the match control signal $C_B$ to the AND gate 125 and to the AND gate 63 of FIG. 8.

If it is desired to write a word into the particular word address, a write signal W is also supplied to the AND gate 125. The signal W is gated through to all the shift registers upon occurrence of the match control signal $C_B$ to write a word into the particular word position 1 .. N represented by the n-bit word address.

If it is desired to read the particular word represented by the n bit word address, the AND gates 63, 67, 59 of FIG. 8 are enabled by the signals CB, RA, and R, as previously discussed. Of course, the match control signal CB lasts for only one clock pulse since the next clock pulse changes the count of the read/write address counter 113 and hence the contents of the address gates 117. Thus, only the particular word indicated by the word address bits will be inputted or outputted from the selected memory section $S_1, S_2 \ldots S_L$.

If, on the other hand, the access indicated is to a word in a memory section $S_1 \ldots S_L$ currently being refreshed, the control signal $\overline{C} = 0$ inhibits the read/write address counter 113, and the control signal $C = 1$, activates the refresh status counter 115. The content of the address gates 117 is then the count of the refresh status counter 115, which counts the number of clock pulses delivered by the refresh clock 74. Thus, the indicated word may be read out during refresh if it is circulated past the output AND gates 59 such that the output of the counter 115 equals the word address in the read/write comparator 119.

As above indicated, if writing is desired with respect to a memory section $S_1 \ldots S_L$ which is currently being refreshed, such access is inhibited by the control signal $\overline{C}$ inputted to the AND gate 121. However, if skewed reading out of data from a particular memory section $S_1, S_2 \ldots S_L$ is requested, it is implemented by use of an n-bit skew address latch 78, which receives an input from the incoming request signal $I_R$, the control signal C and the output of the refresh status counter 115. When a block access read operation is requested on a memory section under refresh the readout of data will be immediately started. When the control signal C becomes equal to "1" upon such a request, it activates the skew address latch 78. The latch 78 then stores an n bit representation of the number of refresh pulses delivered while data is being read out. When the control signal C goes low, the read/write clock 112 completes the readout. The control signal C may be immediately forced to zero after N refresh clock pulses by supplying the output of the counter 101 of FIG. 7 to the $C_R$ input of the flip-flop 83 of FIG. 6. The information in the skew address latch 78 may be then used to realign the skewed data read out from the particular accessed section $S_1, S_2 \ldots S_L$, for example by rotating the data words with a proper number of clock pulses, the number being derived from the skew latch information. The actual implementation of a skew address latch according to the requirements here disclosed is well within the capability of one of ordinary skill in the art enabled by this disclosure.

If immediate write-in of data is also desired, the input $\overline{C}$ to the AND gate 121 may be completely eliminated.

The proper sequencing of data may then be provided by presenting the memory with a block of data already ordered to compensate for the skew which would occur upon writing.

Thus, in the preferred embodiment of the invention, block writing and reading can be started immediately upon request provided skewed block data is accepted for external realignment. Such a capability is a very important consideration if the memory is to be used as an auxiliary memory. In the case of immediate access, the block access time is very small. If skewed block transfer is not desirable, then the average block access time during a refresh is N/2 x cycle time. In all cases when a particular memory section is not refreshed, the block access time is only a few hundred nanoseconds because the beginning of the block is immediately available. The skewed block transfer provision insures that the memory always gives immediate response to any block transfer request.

The memory organization of the preferred embodiment of the invention may be applied to any dynamic semiconductor shift register components like MOS or charge coupled devices. Different portions of the driving, decoding and clock circuits may be integrated into the memory devices themselves. Similarly, one or more of the shift register loops may be designed into single integrated circuits. Such a chip organization is very attractive from a power dissipation point of view since only one or two shift registers out of the total will be moving at any time. Thus, many modifications and changes in the preferred embodiment of the invention as specifically described may be made without departing from the scope and spirit of the invention. Therefore, it is to be understood that, within the scope of the appended claims, the invention may be practiced other than as specifically described.

What is claimed is:

1. A memory system comprising:
   memory means having a plurality of memory sections each comprising a plurality of N-bit parallel recirculating charge storage shift registers;
   means for cyclically refreshing said memory means by successively refreshing each of said memory sections at predetermined times, complete memory section at a time;
   means for selectively accessing the contents of any said memory section in response to a presented memory section address; and
   means for suppressing said refreshing means from refreshing a respective memory section during a cycle, if said respective memory section is undergoing access at the time for refreshment and for inhibiting said accessing means from accessing a selected memory section when said selected memory section is undergoing refresh.

2. The memory system of claim 1 wherein said refreshing means comprises:
   means for repeatedly producing a sequence of refresh addresses, each said refresh address representing a particular said memory section; and
   refresh means for circulating the contents of each said charge storage shift register in a said particular memory section when the said refresh address of that particular memory section is produced by said producing means.

3. The memory system of claim 2 wherein said address in said sequence is produced by incrementing the address preceding it in said sequence.

4. The memory system of claim 1 wherein said selectively accessing means includes:
   read/write means for circulating the contents of the memory section represented by said presented section address.

5. The memory system of claim 4 wherein said refreshing means comprises:
   means for repeatedly producing a sequence of refresh addresses, each said refresh address representing a particular said memory section; and
   refresh means for circulating the contents of each said charge storage shift register in a said particular memory section when the said refresh address of that particular memory section is produced by said producing means.

6. The memory system of claim 5 wherein said inhibiting means comprises:
   memory section comparator means for inhibiting said refresh means if a refresh address equal to a current presented address is produced by said producing means, and for inhibiting said read/write means if a said memory section address equal to a refresh address of a memory section currently being refreshed by said refresh means is produced.

7. The memory system of claim 1 wherein the number of said memory sections equals a whole number $L = 2^l$ and wherein said means for repeatedly successively refreshing each said memory section comprises:
   means for producing successive refresh addresses 1 through l;
   refresh decoder means for decoding said refresh addresses to produce for each said address a unique output signal corresponding to a particular one of said L memory sections;
   refresh clock means for producing a burst of N refresh clock pulses simultaneous with the producing of each said successive refresh address; and
   means for gating said burst of clock pulses to the said memory section corresponding to said unique output signal.

8. The memory system of claim 7 wherein said means for selectively accessing the said contents of any said memory section comprises:
   read/write decoder means for decoding said presented memory section address to produce a unique signal corresponding to the particular memory section to be addressed;
   read/write clock means for producing a burst of N read/write clock pulses simultaneously with said decoding; and
   means for gating said burst of N pulses to the said particular memory section addressed.

9. The memory system of claim 8 wherein said inhibiting means comprises:
   memory section comparator means for inhibiting said refresh decoder and said refresh clock if said refresh address becomes equal to said presented memory section address and for inhibiting said read/write decoder and said read/write clock if said presented memory section address becomes equal to said refresh address.

10. The memory system of claim 9 wherein said memory section comparator means includes:
    means for producing a first control signal when an access is requested to a memory section under refresh;
    means for producing a second control signal which is the inverse of said first control signal; and means for producing a third control signal when a refresh is directed on a said memory section undergoing access.

11. The memory system of claim 9 including a memory clock producing first clock pulse signals and wherein said means for producing successive refresh addresses comprises:
   counter means driven by said first clock pulse signal for producing successive outputs 1 through l, resetting and repeating said production of successive outputs.

12. The memory system of claim 11 wherein said memory clock also produces second clock pulse signals and wherein said refresh clock means comprises:
   flip-flop means receiving one input from said first clock pulse signals for producing a control level upon occurrence of said first clock signal;
   first gate means for outputting said second clock pulse signals upon production of said control level and terminating said outputting upon removal of said control level;
   second gate means fed by the output of said first gate means for transmitting said second clock pulse signals only when said third control signal is not produced; and
   N-bit counter means for resetting said flip-flop means to remove said control level after N clock signals have been transmitted by said second gate means.

13. The memory system of claim 8 wherein each said memory section contains a block of words each accessible in parallel and wherein said memory section accessing means further includes:
   means for inhibiting writing of a block of data into a said section undergoing refresh and enabling reading out of a block of data from a said memory section undergoing refresh.

14. The memory system of claim 13 wherein said inhibiting means includes:
   skew address latch means for developing a correction signal for realigning a block of data read out from a said memory section undergoing refresh.

15. The memory system of claim 14 adapted to be supplied with read and write signals, a word address, a memory section address and a random access signal and further including means for randomly accessing a particular word in a particular said block of words in response to said word address, said memory section address and said random access signal.

16. The memory system of claim 15 wherein said random access means comprises:
   read/write address counter means for producing an output equal to a binary count of the said read/write clock pulses;
   refresh status counter means for producing an output equal to a binary count of said refresh clock pulses;
   means for comparing the count of said read/write address counter to said word address if the memory section represented by said memory section address is not undergoing refresh and for comparing the output of said refresh status counter to said word address if the memory section represented by said memory section address is undergoing refresh and for producing a compare output upon equality between said count and said word address or said refresh counter output and said word address;
   means for writing into the memory section represented by said memory section address upon occurrence of a said write signal and a said compare output; and
   means for reading out of said memory section represented by said memory section address upon occurrence of a said read signal and a said compare output.

17. A method of refreshing a memory composed of a plurality of memory sections, each section including a plurality of N-bit recirculating charge storage device shift registers arranged for parallel access in response to a presented read/write address, said method comprising the steps of:
   producing a sequence of refresh address, each said refresh address corresponding to one of said memory sections;
   producing a burst of N refresh clock pulses simultaneously with production of each said address in said sequence;
   gating a said burst of N refresh clock pulses to the said memory section corresponding to the said address produced simultaneously with the said burst;
   decoding said presented read/write address and gating a burst of N read/write clock pulses to the said memory section represented by said presented read/write address only if that said memory section is not undergoing refresh; and
   inhibiting said gating of said burst of N refresh clock pulses to a said memory section when that said memory sections's said refresh address is produced during said gating of a burst of said N read/write clock pulses.

18. In a computer accessible recirculating memory system composed of a plurality of charged storage device memory sections wherein data is automatically refreshed upon computer memory access thereof, a methof of internally refreshing said memory comprising the steps of:
   successively refreshing each of said memory sections at
   fixed predetermined times in repetitive intervals with a burst of refresh clock pulses;
   suppressing a successive refresh of a said memory section if that section is undergoing a computer memory access at the time for refreshment by a said burst of refresh clock pulses; and
   inhibiting computer memory access of a memory section if that section is undergoing an internal refresh operation, whereby said memory sections are successively refreshed at said fixed predetermined times in said repetitive intervals either by an internal burst of refresh clock pulses or by computer memory access.

* * * * *

UNITED STATES PATENT OFFICE
CERTIFICATE OF CORRECTION

Patent No. 4,084,154    Dated April 11, 1978

Inventor(s) Godavarish Panigrahi

It is certified that error appears in the above-identified patent and that said Letters Patent are hereby corrected as shown below:

Col. 3, line 34   after "lines" insert -- $F_{R, \phi_1}$ --;

Col. 4, line 47   "C" should be -- $\overline{C}$ --;

Col. 5, line 21   "F" should be -- $\overline{F}$ --;

Col. 5, line 38   "C" (third instance) should be -- $\overline{C}$ --.

Signed and Sealed this

Third Day of October 1978

[SEAL]

Attest:

RUTH C. MASON
*Attesting Officer*

DONALD W. BANNER
*Commissioner of Patents and Trademarks*